United States Patent [19]

Culbertson et al.

[11] Patent Number: 5,285,067
[45] Date of Patent: Feb. 8, 1994

[54] MICROWAVE DETECTION OF A SUPERCONDUCTING INFRARED SENSOR

[75] Inventors: James C. Culbertson; Harvey S. Newman; Jeffrey M. Pond, all of Alexandria, Va.; Stuart A. Wolf, Bowie; Ulrich Strom, Hyattsville, both of Md.

[73] Assignee: The United States of America as represented by the Secretary of the Navy, Washington, D.C.

[21] Appl. No.: 846,633

[22] Filed: Mar. 5, 1992

[51] Int. Cl.$^5$ .............................................. H01L 39/00
[52] U.S. Cl. ................................. 250/336.2; 505/866; 505/849
[58] Field of Search ................. 250/336.2; 505/848, 505/849, 866

[56] References Cited

U.S. PATENT DOCUMENTS

| | | | |
|---|---|---|---|
| 3,691,381 | 9/1972 | Kleppner | 250/336.2 |
| 3,906,231 | 9/1975 | Fletcher et al. | 250/336.2 |
| 4,962,316 | 10/1990 | Jack | 250/336.2 |
| 5,043,580 | 8/1991 | Hartemann | 250/336.2 |
| 5,070,241 | 12/1991 | Jack | 250/336.2 |
| 5,097,128 | 3/1992 | Jack | 250/536.2 |
| 5,175,606 | 12/1992 | Weinberger et al. | 250/336.2 |

Primary Examiner—Carolyn E. Fields
Assistant Examiner—Drew A. Dunn
Attorney, Agent, or Firm—Thomas E. McDonnell; John J. Karasek

[57] ABSTRACT

Highly sensitive infrared detectors can be made from superconducting microstrip transmission lines, having a single ground plane, a dielectric substrate on the ground plane, and a thin film path of superconducting oxide on the substrate. These microstrip transmission lines can be fabricated into resonant or non-resonant structures. The detectors operate by detecting changes in a microwave signal transmitted through the microstrip, measures in the amplitude, frequency or time domains. An embodiment of this invention is an asymmetric ring interferometer, with or without a metal segment in the shorter leg of the interferometer. Another embodiment of this invention is a meander path transmission line, which, in certain configurations, may be used as a single element array with very high resolution in the direction parallel to the meander lines.

13 Claims, 5 Drawing Sheets

MICROWAVE DETECTION OF A SUPERCONDUCTING INFRARED SENSOR

BACKGROUND OF THE INVENTION

1. Field of the Invention

This invention relates to superconducting microstrip transmission lines and to infrared radiation detectors fashioned from these microstrip transmission lines.

2. Description of the Prior Art

Infrared radiation detectors, used both as individual sensors and as elements in infrared sensing arrays, are used in a wide variety of applications. Superconducting infrared sensors have significant advantages over the more commonplace semiconducting infrared sensors. These advantages include a lack of Johnson noise, and superior optical and thermal hardness. It is desired to make such superconducting infrared sensors out of the new high critical temperature $T_c$ superconducting oxides, since they can be operated at relatively high temperatures.

Highly sensitive superconducting infrared sensors can be made from Josephson junctions. However, it is very difficult to process the new high $T_c$ superconducting oxides into Josephson Junctions. The high $T_c$ oxides are just beginning to be made into Josephson junctions.

Stripline structures made from high $T_c$ superconductors have been used as infrared sensors. These structures are easier to produce than Josephson junctions. A stripline structure comprises a dielectric substrate with a superconducting transmission line on the substrate, and two ground planes sandwiching the substrate. A problem with these structures is their relatively low sensitivity. In a stripline detector, the infrared radiation to be detected shines on the ground plane, where the field in the structure is at its lowest. This low field results in a low detection signal.

SUMMARY OF THE INVENTION

Accordingly, it is an object of this invention to provide a superconducting microstrip transmission line for use in an infrared sensor.

It is a further object of this invention to provide a superconducting infrared sensor having one or more microstrip transmission lines suitable for use as a single sensor or as an element in an infrared sensing array.

It is a further object of this invention to provide a superconducting infrared sensor having one or more microstrip transmission lines fabricated into a nonresonant structure for use in an infrared sensor.

It is a further object of this invention to provide a superconducting infrared sensor having one or more microstrip transmission lines fabricated into a meander path structure for use in an infrared sensor.

It is a further object of this invention to provide a superconducting infrared sensor having one or more microstrip transmission lines fabricated into a resonant structure for use in an infrared sensor.

It is a further object of this invention to provide a superconducting infrared sensor suitable for use as a single element array.

It is a further object of this invention to provide a superconducting infrared sensor operating in the amplitude domain.

It is a further object of this invention to provide a superconducting infrared sensor operating in the frequency domain.

It is a further object of this invention to provide a superconducting infrared sensor operating in the time domain.

These and additional objects of the invention are accomplished by the structures hereinafter described.

This invention features a superconducting microstrip transmission line which includes a single metallic or superconducting ground plane, a dielectric substrate on the ground plane, and a thin film path of high $T_c$ superconducting material on the substrate. Suitable superconducting materials include any of the high $T_c$ superconducting oxides, including $YBa_2Cu_3O_{7-\sigma}$ (YBCO), $Bi_aSr_bCa_cCu_dO_x$ (BSCCO), $La_{2-x}(Ba,Sr)_xCuO_{4-\delta}$ (LaSCO), etc. The miorostrip should be thick enough to serve as a low-loss (i.e. high quality factor Q) microwave guide, but thin enough to act as a non-equilibrium or bolometric sensor.

The microstrip transmission line is distinguishable from stripline structures in that the microstrip line uses a single ground plane, compared to the two ground planes used in striplines. The superconducting microstrip makes a more sensitive infrared sensor than those made from striplines. This greater sensitivity is due to the infrared radiation striking the superconducting thin film path where the field is highest, rather than striking the upper ground plane, where the field is lower.

The invention also utilizes a microwave signal source, and a microwave signal detector, connected to remote points along the microstrip. The microstrip acts as a waveguide for the microwave signal. The invention operates as an infrared sensor by detecting changes in the microwave signal when infrared radiation shines on the microstrip. These changes can be attributed to both bolometric (thermal) and non-bolometric effects (such as Cooper pair breaking).

The sensor is operated in the frequency and amplitude domains by sending a microwave signal through the microstrip line to the microwave detector. When infrared radiation shines on the microstrip, it raises the temperature of the microstrip. The incident infrared radiation also changes the number of Cooper pairs $n_s$ in the system. Both the temperature increase and the change in the number of Cooper pairs act to attenuate and change the frequency of the microwave transmission. These changes can be measured when the sensor is operated in amplitude or frequency domain, respectively.

When the sensor is operated in the time domain, a pulse train input signal is used. When infrared radiation shines on the microstrip, it raises the temperature of the microstrip. The infrared radiation also changes the number of Cooper pairs in the system. The magnetic penetration depth $\lambda$ is a function of both temperature and $n_s$. The time delay of the transmission line $T_D$ is in turn a function of $\lambda$. Thus $T_D$ will change when infrared light shines on the microstrip. Changes in $T_D$ can be detected by monitoring changes in the intervals between pulses in the pulse train signal.

In one embodiment, this invention features a microstrip following a meander path. A meander path microstrip is one where the thin film path follows a continuous back-and-forth path. It typically has a series of essentially parallel lines of superconducting material connected in series by lines of superconducting material to form a single continuous path. One end of this path is coupled to the microwave source, the other end is coupled to the microwave detector.

This meander path structure can be used as a single element infrared sensor, as an element in an infrared sensing array, or as a single element sensing array. This meander path structure can operate in the amplitude, frequency, or time domains.

The meander path sensor can be scaled down to a size small enough to allow it to be incorporated as an element in an infrared sensor array. Currently available engineering techniques would allow these sensors to be scaled down to a size of about 100 $\mu$m $\times$ 100 $\mu$m, and as engineering techniques improve, it is expected that these elements can be made even smaller.

In another embodiment of this invention, the meander path microstrip is used as a single element array operating in the time domain. A single element array is a device comprising a single sensor that can provide the same spatial information that a traditional multiple element array can provide.

In this embodiment, a large (about 0.25 in.$^2$ to about 2.0 in.$^2$) meander path microstrip, with a large $T_D$ (about 1.0 nsec to about 100 nsec) is connected to a microwave pulse train source. When infrared radiation shines on a point along the microstrip, it causes a localized change in the $T_D$ of the line. This will in turn cause a localized perturbation in the interval between pulses in the train. By identifying which pulses have a changed interval between them, the point along the microstrip where the infrared radiation struck the sensor can be determined.

This single element array further comprises means for modulating or chopping the incoming infrared light. This chopping means acts as a shutter, taking a "snapshot" of the waves in the line.

In operation, the incoming infrared light is chopped so that the light shines on the line only for short time compared to the interval between pulses. Each chopping cycle begins with the shutter closed. As the pulse train source sends its signal through the line, the line fills with a series of pulses. After the pulse train operates for a time equal to $T_D$, the line is completely filled with this series of pulses. At this time the shutter opens for a time less than the time interval between pulses, and then closes. This series of pulses then passes into the detector. The detector identifies which of the pulses in the series have been perturbed by the infrared radiation, and thereby identifies the point along the line where the infrared radiation struck the line. Suitable chopping means include electro-optic filters. The sampling rate of the detector should be equal to the chopping rate of the incoming radiation.

Depending on the input pulse interval selected, this system can have extremely high resolution in the direction parallel to the meander lines. Resolution in this direction is limited by the intervals between pulses. Resolution in the direction perpendicular to the meander lines is limited by the distance between adjacent parallel lines. This system can also use much simpler electronics than a traditional multiple element array, since it will not require the switching and scanning means that a multiple element array requires.

Another embodiment of this invention features a microstrip transmission line fabricated into an asymmetric ring interferometer. In this embodiment, the superconducting thin film path comprises a circular path divided into two separate paths or legs. The lengths of the legs of the interferometer and the frequency of the microwave signal are selected so that the two signals interfere at the output port. When infrared radiation strikes one of the legs of the path, the frequency and the amplitude of the signal on this leg will change, and this change can be measured by the change in the interference signal at the output port. The measured change can either be in the depth of the null (amplitude domain) or the frequency at which the null is observed (frequency domain). When the signals interfere constructively, the measured change can either be in the height of the peak (amplitude domain) or the frequency at which the peak is observed (frequency domain).

The asymmetric ring interferometer may also be made where a portion of shorter leg of the circular path is made of metal. For two reasons, this novel interferometer will be more sensitive than an interferometer without such a metal segment in the circular path.

The first reason is that an interferometer with a metal segment can be attenuation-matched (i.e. the attenuation of the two legs can be made equal). Typically in an asymmetric ring inter ferometer, the attenuation along the shorter leg is lower than the attenuation along the longer leg. If the attenuations are not equal, then the null that is measured under interference conditions is not as deep as it would be if the two interfering signals were equally attenuated.

The attenuations of the two interfering signals can be matched by making a segment of the shorter leg out of metal instead of superconductor. However, because of the differing properties of the metal and the superconductor, an asymmetric interferometer made this way will only be attenuation matched at a particular temperature. Above or below this temperature, the metal segment of the ring will quickly become more or less attenuating than it is at the matching temperature. Because of this, the asymmetric ring interferometer may be designed so that the attenuation-matching temperature is also the operating temperature of the interferometer. Thus, when infrared radiation strikes a point on the path, the temperature at that point rises, the attenuation-matching is lost, and a signal is produced at the interferometer output.

The second reason is that the kinetic inductances of the normal conductor and the superconductor respond differently to temperature changes.

Destructive interference occurs when the two interfering signals are completely out of phase, e.g. when the interferometer's two legs differ in length by half a wavelength. When an interferometer is heated, the kinetic inductance changes. This in turn changes the propagation velocity $v_p$ of the microwaves travelling in the interferometer. However, the temperature dependence of $v_p$ for superconductors is very different from the temperature dependence of $v_p$ for normal conductors. Consequently, if a segment of the interferometer is made of normal conductor, a temperature increase in the interferometer, due to infrared radiation, will quickly change the interference frequency of the microwave signal.

This interferometer can be used as a single element infrared sensor or as an element in an infrared sensing array. This interferometer can operate in the amplitude or frequency domains. Like the meander path sensor, the interferometer can be scaled down to a size of 100 $\mu$m $\times$ 100 $\mu$m or smaller, small enough to allow it to be incorporated as an element in an infrared sensor array.

Another embodiment of this invention features a resonant microstrip transmission line. In this embodiment, the microstrip may be fashioned into any resonant structure, such as a ring resonator, a disc resonator, and a coupled line resonator. A resonant structure is one that has both capacitance and inductance. Like the non-resonant structures described above, these devices can be used as single infrared sensors or as elements in infrared sensing arrays and can be scaled down to sizes of 100 μm×100 μm or smaller. These infrared sensors can be operated in the frequency and amplitude domains.

When the sensor comprises a resonant structure, there will be a characteristic resonant frequency of the sensor such that when a microwave source signal of this frequency is applied to the input port of the microstrip, the microwave output signal is much stronger than at other frequencies. When infrared radiation strikes a resonant sensor according to this invention, the inductance of the system will change. Since the resonant frequency is a function of inductance, this too will change when infrared light strikes the sensor. This change can be monitored in either the frequency domain or in the amplitude domain by monitoring the amplitude at the original resonant frequency.

One example of this embodiment of the invention is a ring resonator. In this structure, the thin film path is fabricated into a circle (i.e. annular path) adjacent to a tangent line. The line serves as the input and output ports for the resonator, with one end connected to the microwave frequency source and the other end connected to the microwave frequency detector. The line is separated from the circle by a small gap. These gaps provide the capacitance for the system, and the circular shape of the ring provides the inductance for the system. The gap should be no larger than the maximum distance that will allow the input/output line to field couple with the circular path.

Another example of this embodiment of the invention is a different form of a disc resonator. In this version of a ring resonator, there are separate input and output lines normal to the ring, each separated from the ring by a small gap. The input and output lines are coupled to the microwave frequency source and microwave frequency detector, respectively.

Another example of this embodiment of the invention is a disc resonator. This structure is very similar to a ring resonator, except that in the disc resonator, the superconducting thin film path forms a disc instead of a circle. Since a disc resonator will typically have a higher Q than an ring resonator, this structure would be expected to give even better results than the ring resonator.

Another example of this embodiment of the invention is a different form of a disc resonator. In this version of a disc resonator, there are separate input and output lines normal to the disc, each separated from the disc by a small gap. The input and output lines are coupled to the microwave frequency source and microwave frequency detector, respectively. This structure also has a very high Q and consequently would have a very high sensitivity when used as an infrared detector.

Another example of this embodiment of the invention is a coupled line resonator. In this structure, the thin film path comprises two adjacent essentially parallel line segments separated by a small gap no larger than the maximum distance that will allow for field coupling between the line segments. Typically, the microwave source input will be coupled to one end of one of these segments, while the microwave detector output is coupled to the opposite end of the other segment.

As noted above, this invention may be embodied as any resonant structure. Disk resonators and coupled line resonators should give better results than the ring resonator, due to their higher Q. However, any resonant structure may be used as a superconducting microstrip infrared sensor according to this invention.

DETAILED DESCRIPTION OF THE PREFERRED EMBODIMENTS

Figure 1:
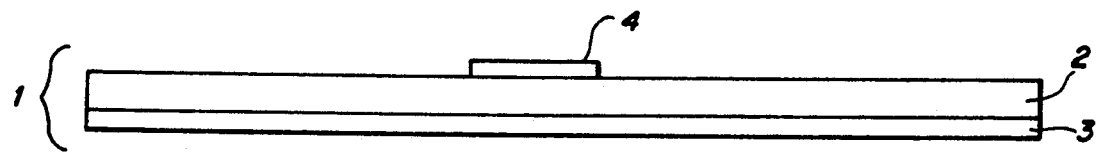
FIG. 1 is a cross sectional view, not to scale, of a microstrip transmission line according to this invention.

As shown in FIG. 1, a superconducting microstrip transmission line 1 according to this invention is made with a dielectric substrate 2. The substrate may be amorphous, polycrystalline, or monocrystalline. The substrate is made of any dielectric material, including oxides of Mg, Al, zirconium or rare earth elements, silicon dioxide or silicon nitride, $LaAlO_3$, $NdGaO_3$, or any other substrate upon which a high quality high $T_c$ superconductor may be deposited. Polycrystalline MgO has been used successfully, as described in the examples below.

The thickness of the substrate will vary between about 0.1 mm and about 1.0 mm, and will typically be between about 0.4 mm and 0.6 mm. The exact thickness of the substrate will depend on the dielectric constant of the material and the desired resonant frequency of the resonant sensor.

A single ground plane 3 of any conducting metal, such as Ag or Cu, or of a superconducting oxide is deposited on the backside of the substrate 2. If a superconducting oxide is used as the ground plane, it would be preferred, for the sake of convenience, to use the same superconducting oxide used in the superconducting thin film path. Ag and Cu are the preferred metals for use in the ground plane, due to their good electrical properties and moderate cost. The thickness of the ground plane will vary between about 1000 Å and about 2 μm, and will typically be between about 0.5 μm and about 1.0 μm.

A superconducting microstrip transmission line 1 according to this invention is made with a superconducting thin film path 4 deposited on the side of the substrate 2 opposite the ground plane 3. The superconducting transmission line is a thin film of any high $T_c$ superconducting oxide, including $YBa_2Cu_3O_{7-\delta}$ (YBCO), $Bi_aSr_bCa_cCu_dO_x$ (BSCCO), $La_{2-x}(Ba,Sr)_xCuO_{4-\delta}$ (LaSCO), etc.

The thickness of the superconducting thin film path will vary between about 500 Å and about 10,000 Å. The exact thickness of the thin film path will depend on whether the sensor is being optimized to detect bolometric effects or whether it is being optimized to detect non-bolometric effects of the infrared radiation. If the thickness of the thin film path is much greater than λ, the microstrip will be low-loss and will be optimized for detecting bolometric effects. If the thickness of the thin film path is less than λ, the sensor will be optimized for detecting non-bolometric effects.

The invention is operated below the $T_c$ of the superconductor. It is preferred to operate the invention at least 3°-4° C. below $T_c$, since this will generally provide a better response than when the invention is operated closer to $T_c$.

Figure 2:
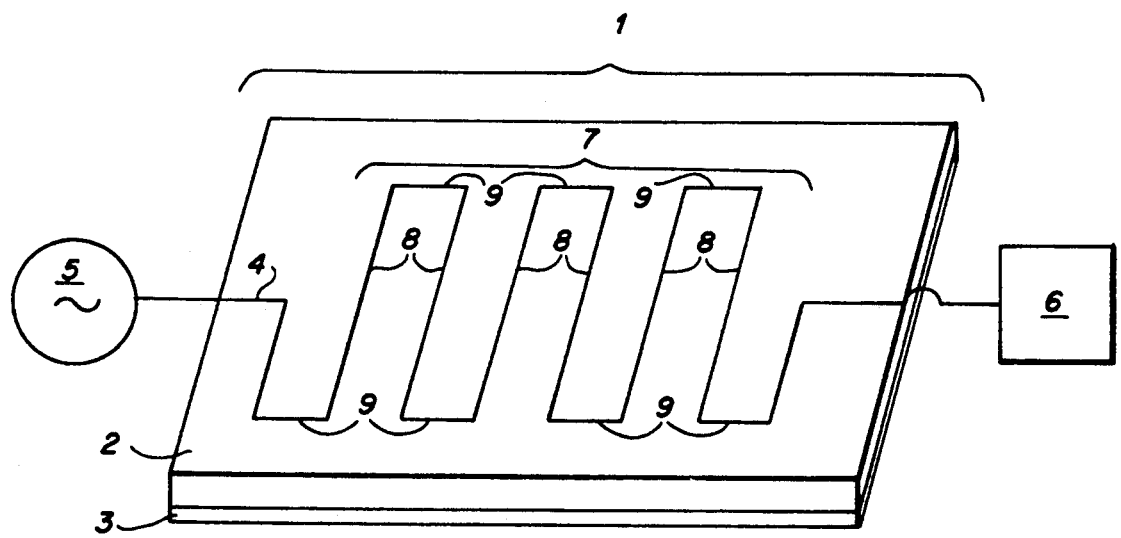
FIG. 2 is a representative perspective view, not to scale, of an infrared detector according to this invention.

As shown in FIG. 2, a superconducting microstrip transmission line infrared detector according to the present invention is made with a superconducting microstrip transmission line 1 as described above, a microwave signal source 5, and a microwave signal detector 6.

When the invention is operated in the amplitude or frequency domains, the microwave source signal is a sinusoidal signal with a frequency that will vary between about 1 GHz and about 90 GHz, and will typically be between about 5 GHz and 20 GHz. The frequency selected will be determined by the size of the sensor required. If a smaller sensor is required, a higher frequency will be selected.

When the invention is operated in the time domain, the microwave source signal is a pulse train signal with a pulse duration that typically is between about 0.1 nsec and about 10 nsec and will preferrably be between about 0.4 nsec and about 1.0 nsec, The pulse interval is typically between about 0.1 nsec and about 100 nsec and preferrably is between about 0.5 nsec and about 2.0 nsec. The pulse duration and interval selected will be determined by the sensitivity desired and the resolution of the microwave detector in use. The preferred detector for time domain operation is a transient recorder.

When the invention is operated as a meander path sensor, the superconducting thin film path 4 follows a meander path 7. The meander path is comprised of a series of essentially parallel lines of superconducting material 8 connected in series by lines or arcs of superconducting material 9 to form a single continuous path. The meander lines preferably are parallel and spaced no farther apart than the width of the infrared beam the sensor is intended to detect.

Figure 10:
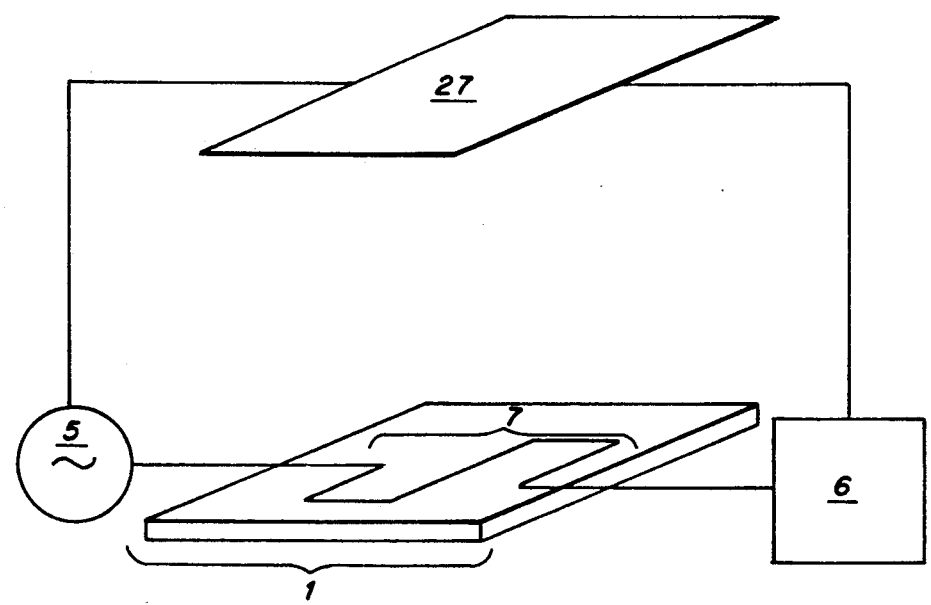
FIG. 10 is a representative perspective view, not to scale, of an infrared detector according to this invention that may be operated as a single element array where the microstrip transmission line forms a meander path and where the microwave signal source and detector are coupled to a means for chopping the incoming infrared radiation that is to be detected.

As shown in FIG. 10, when the invention is operated as a meander path single element array, the $T_D$ of the line typically will be between about 1.0 nsec and about 100 nsec, and will preferrably be between about 20 nsec and about 60 nsec. It is preferred to operate this sensor with small intervals between the pulses in the pulse train to maximize the resolution in the direction parallel to the meander lines. It is preferred to operate this sensor with the meander lines spaced as closely together as possible to maximize resolution in the direction perpendicular to the meander lines. The chopping means 27 should be coupled to the microwave pulse train source to ensure that the incoming light is chopped at the same rate that a series of pulses is loaded into the transmission line. The chopping means should also be coupled to the microwave detector to ensure that the sampling rate is the same as the chopping rate.

Figure 3:
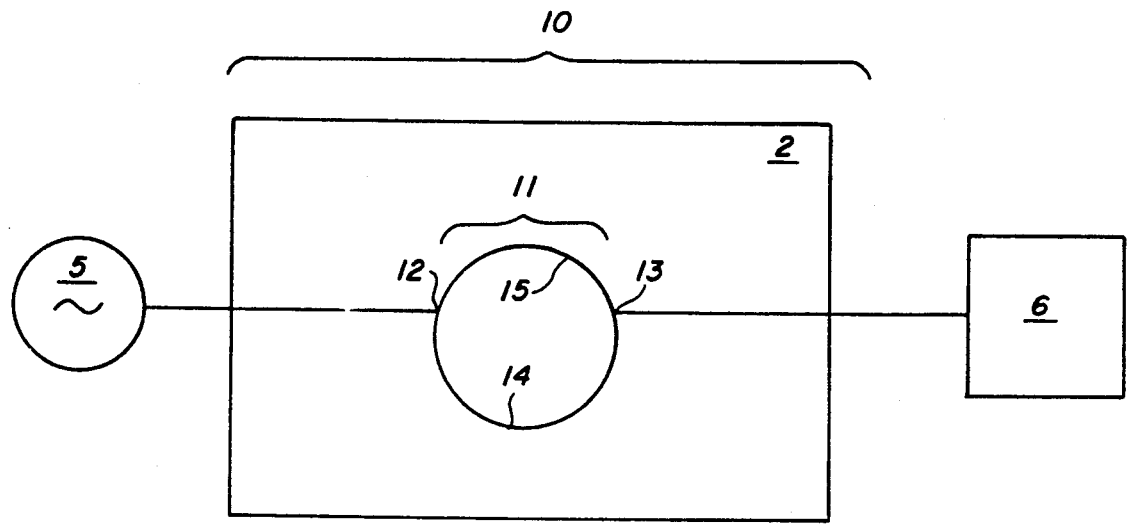
FIG. 3 is a representative top view, not to scale, of an infrared detector according to this invention where the microstrip transmission line forms an asymmetric ring interferometer.

As shown in FIG. 3, in the asymmetric ring interferometer, the superconducting thin film path is fabricated into a circular path 11, and the legs of the interferometer 14, 15 are not of equal length. Preferably, the input 12 and output 13 ports of the interferometer will be spaced and the frequency of the microwave source selected so that the signals travelling along the two legs of the interferometer destructively interfere at the output port. Most preferably, the length of the longer leg of the interferometer is about twice the length of the shorter leg.

Figure 4:
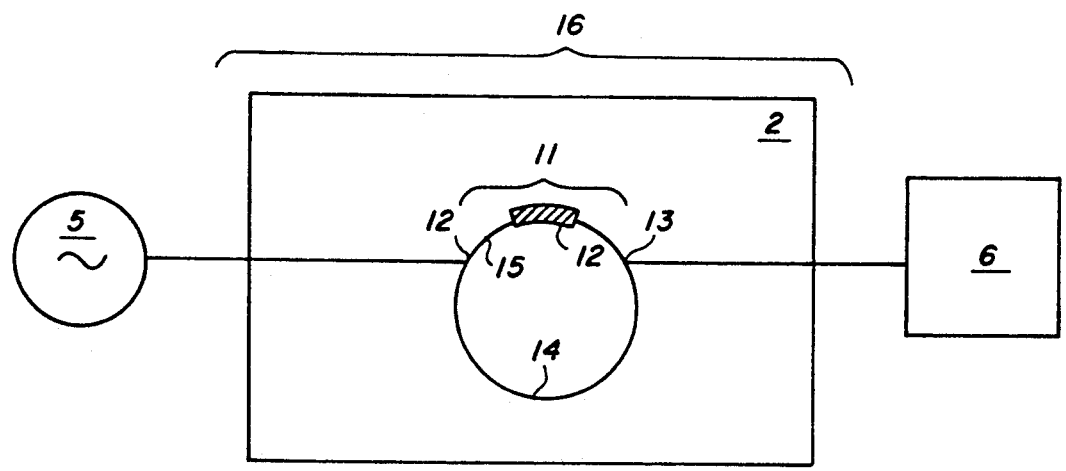
FIG. 4 is a representative top view, not to scale, of an infrared detector according to this invention where the microstrip transmission line forms an asymmetric ring interferometer and where a segment of the shorter leg is made of normal metal.

As shown in FIG. 4, the asymmetric ring interferometer may also be made where a portion 17 of shorter leg of the circular path 15 is made of metal. For two reasons, this interferometer will be more sensitive than an interferometer without such a metal segment in the circular path.

The first reason is that an interferometer with a metal segment can be attenuation-matched (i.e. the attenuation of the two legs can be made equal). Typically in an asymmetric ring interferometer, the attenuation along the shorter leg is lower than the attenuation along the longer leg. If the attenuations are not equal, then the null that is measured under interference conditions is not as deep as it would be if the two interfering signals were equally attenuated.

The attenuations of the two interfering signals can be matched by making a segment of the shorter leg out of metal instead of superconductor. However, because of the differing properties of the metal and the superconductor, an asymmetric interferometer made this way will only be attenuation matched at a particular temperature. Above or below this temperature, the metal segment of the ring will quickly become more or less attenuating than it is at the matching temperature. Because of this, the asymmetric ring interferometer may be designed so that the attenuation-matching temperature is also the operating temperature of the interferometer. Thus, when infrared radiation strikes a point on the path, the temperature at that point rises, the attenuation-matching is lost, and a signal is produced at the interferometer output.

The second reason is that the kinetic inductances of the normal conductor and the superconductor respond differently to temperature changes.

Destructive interference occurs when the two interfering signals are completely out of phase, e.g. when the interferometer's two legs differ in length by half a wavelength. When an interferometer is heated, the kinetic inductance changes. This in turn changes the propagation velocity $v_p$ of the microwaves travelling in the interferometer. However, the temperature dependence of $v_p$ for superconductors is very different from the temperature dependence of $v_p$ for normal conductors. Consequently, if a segment of the interferometer is made of normal conductor, a temperature increase in the interferometer, due to infrared radiation, will quickly change the interference frequency of the microwave signal.

For these two effects to be observed in the operating interferometer, the width of the normal metal segment must be no larger than the coherence length of the microwave signal at the operating temperature of the sensor, to avoid proximity effects between the ends of the superconducting path. Since the coherence length varies with temperature, the selected operating temperature of the sensor will govern the minimum length of the metal segment.

The metal for the metal segment may be applied by any process that will give a good contact with the superconductor, including evaporation, sputter deposition, even painting with metallic paint.

When the invention is operated as a resonant structure, the resonant structure preferably has a high Q to maximize the sensitivity of the sensor. The resonant frequency selected will be determined by the required size and sensitivity of the sensor.

Figure 5:
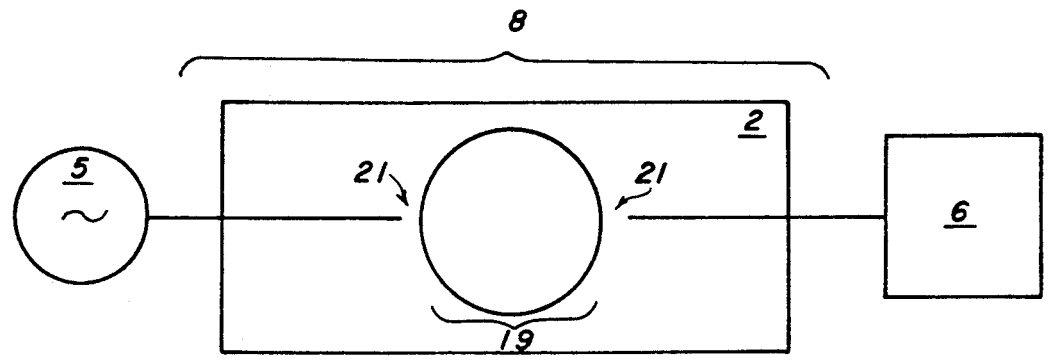
FIG. 5 is a representative top view, not to scale, of an infrared detector according to this invention where the microstrip transmission line forms a ring resonator with an input line and an output line.

As shown in FIG. 5, when the resonant structure is a ring resonator 18 with separate input and output lines, the diameter of the ring 19, the gap width 21 between the ring and the input 24 and output 25 lines, and the resonant frequency of the resonator will be determined by the required sensitivity and size of the sensor.

Figure 6:
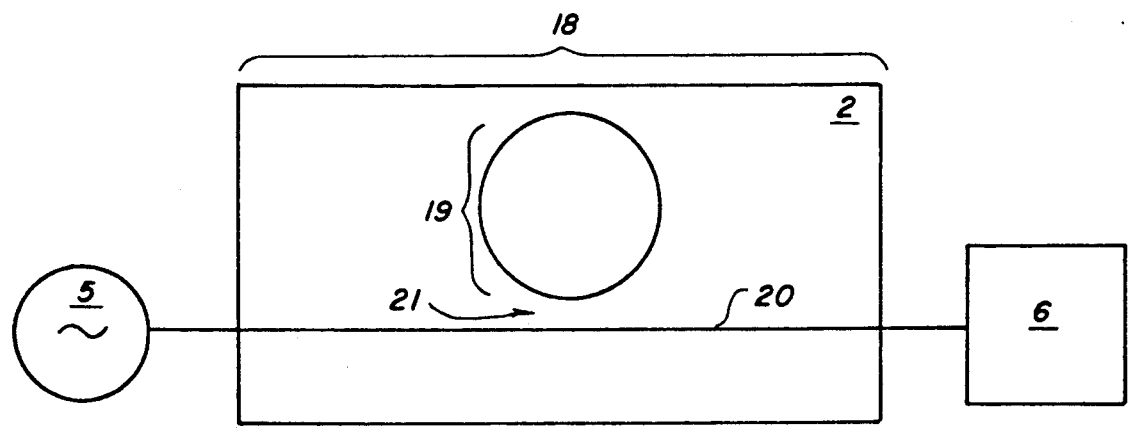
FIG. 6 is a representative top view, not to scale, of an infrared detector according to this invention where the microstrip transmission line forms a ring resonator with an input/output line.

As shown in FIG. 6, when the resonant structure is a ring resonator 18, the diameter of the ring 19, the gap width 21 between the ring and the input/output line 20, and the resonant frequency of the resonator will be determined by the required sensitivity and size of the sensor.

Figure 7:
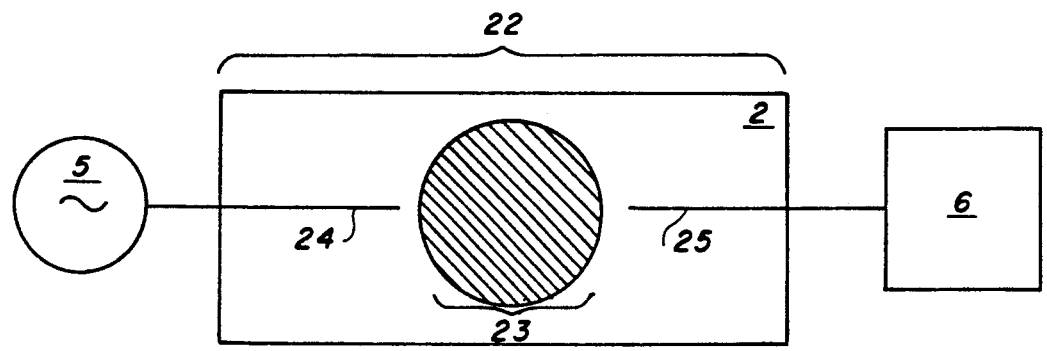
FIG. 7 is a representative top view, not to scale, of an infrared detector according to this invention where the microstrip transmission line forms a disc resonator with an input line and an output line.

As shown in FIG. 7, when the resonant structure is a disc resonator 22 with separate input and output lines, the diameter of the disc 23, the gap width 21 between the disc and the input 24 and output 25 lines, and the resonant frequency of the resonator will be determined by the required sensitivity and size of the sensor.

Figure 8:
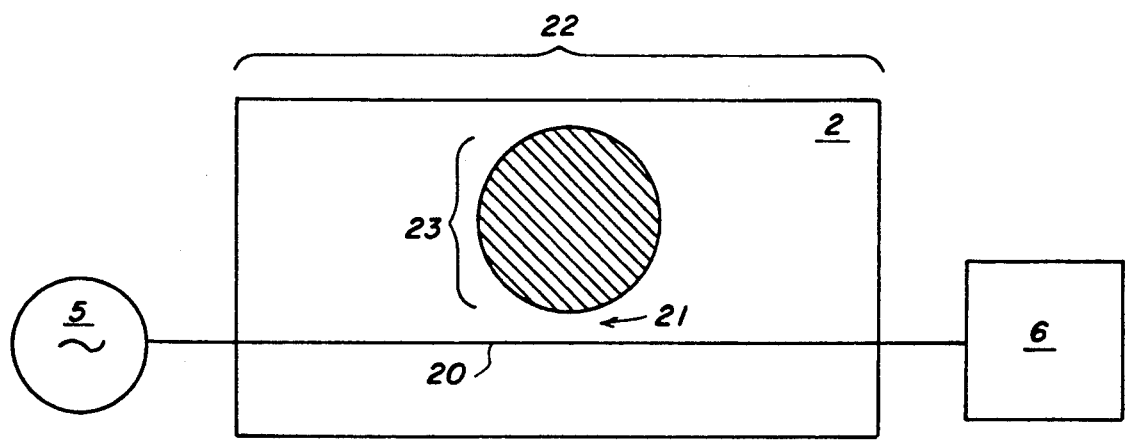
FIG. 8 is a representative top view, not to scale, of an infrared detector according to this invention where the microstrip transmission line forms a disc resonator with an input/output line.

As shown in FIG. 8, when the resonant structure is a disc resonator 22, the diameter of the disc 23, the gap width 21 between the disc and the input/output line 20, and the resonant frequency of the resonator will be determined by the required sensitivity and size of the sensor.

Figure 9:
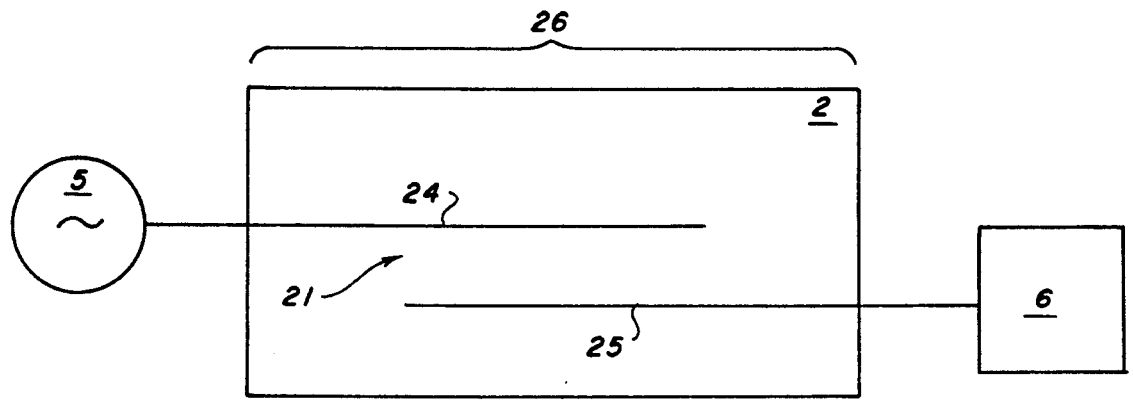
FIG. 9 is a representative top view, not to scale, of an infrared detector according to this invention where the microstrip transmission line forms a coupled line resonator.

As shown in FIG. 9, when the resonant structure is a coupled line resonator 26, the lengths of the line segments 24, 25 and the gap width 21 between the line segments will be determined by the required sensitivity and size of the sensor.

Having described the invention, the following examples are given to illustrate specific applications of the invention including the best mode now known to perform the invention. These specific examples are not intended to limit the scope of the invention described in this application.

EXAMPLE 1

A meander path microstrip is fabricated as follows: The MgO substrate was a 0.508 mm thick square. The film was deposited by laser ablation onto the MgO substrate that was a thermally secured with silver paste. Silver paste was polished off the backside.

1350J photoresist was patterned on the superconducting film using conventional techniques. The film was etched using warm ethylene diamine tetraacetic acid (EDTA). The photoresist was stripped with acetone. The resulting meander path consisted of eight straight strips about 1.27 cm long, which were joined by semicircles to form the meander. The lines were about 0.15 mm wide, and 5000 Å thick.

The ground plane of the microstrip was deposited on the side of the MgO substrate opposite from the superconducting film using Cr/Ag/Au to greater than three skin depths.

The sample was clamped onto a copper platform and DC-18 GHz SMA microwave connectors were attached by means of wire bonds to epoxy placed at the ends of the microstrip. The sample platform was placed on the cold stage of a close cycle refrigerator equipped with DC-18 GHz cryogenic input cables and an optical window. The detector was operated at temperatures ranging from 80 K to 84 K.

A microwave signal generator was connected via DC-18 GHz coax to the input line of the meander path microstrip. The output line of the microstrip was connected via DC-18 GHz coax to a microwave detector. The microwave source and detector were at times part of an HP network analyzer. The microwave source was operated at 2.5 GHz.

A Helium-Neon laser with wavelength of 6328 Å and beam width of about 1 mm was used as the infrared source. The laser illuminated one leg of the interferometer; the incident power was 1 mW. The laser had an effective width of about 2 mm, due to lateral thermal conduction during the measurement. Either a shutter or a light chopper was used to block or modulate the light beam as required.

The change in microwave transmission caused by the light incident on the microstrip was measured, either using a network analyzer or a lockin connected to the output of a microwave diode detector. Measurements were performed both with and without the presence of infrared light. These measurements were taken as a function of microwave frequency and power, sample temperature, etc.

EXAMPLE 2

An asymmetric ring interferometer microstrip is fabricated as follows: The asymmetric ring microstrip geometry was designed and simulated using a computer program called Touchstone by EESOF. The lead in lines to the ring were designed to be 50 ohm lines. The ring part of the microstrip line has a higher impedance because the microwaves entering it split evenly into waves travelling clockwise and counterclockwise around the ring.

The MgO substrate was a 0.508 mm thick square. The film was deposited by laser ablation onto the MgO substrate that was thermally secured with silver paste. Silver paste was polished off the backside.

1350J photoresist was patterned on the superconducting film using conventional techniques. The film was etched using warm ethylene diamine tetraacetic acid (EDTA). The photoresist was stripped with acetone. The resulting ring path was about 0.75 cm in diameter. The ring path was 0.21 mm wide and 3000 Å thick.

The microstrip lines connecting the ring to the microwave source and microwave detector were 0.485 mm wide, this dimension chosen to optimize the coupling into and out of the ring. The input and output transmission lines were positioned 120° apart to make the legs of the interferometer differ in length by a factor of two.

The ground plane of the microstrip was deposited on the side of the MgO substrate opposite from the superconducting film using Cr/Ag/Au to greater than three skin depths. The gap in the shorter leg of the ring was bridged with a film of silver.

The sample was clamped onto a copper platform and DC-18 GHz SMA microwave connectors were attached by means of wire bonds to epoxy placed at the ends of the microstrip. The sample platform was placed on the cold stage of a close cycle refrigerator equipped with DC-18 GHz cryogenic input cables and an optical window. The detector was operated at temperatures ranging from 85 K to 88 K.

A microwave signal generator was connected via DC-18 GHz coax to the input line of the asymmetric ring interferometer. The output line of the interferometer was connected via DC-18 GHz coax to a microwave detector. The microwave source and detector were at times part of an HP network analyzer. The microwave frequency was varied from 2 to 12 GHz.

A Helium-Neon laser with wavelength of 6328 Å and beam width of about 1 mm was used as the infrared source. The laser illuminated one leg of the interferometer; the incident power was 1 mW. The laser had an effective width of about 2 mm, due to lateral thermal conduction during the measurement. Either a shutter or a light chopper was used to block or modulate the light beam as required.

The change in microwave transmission caused by the light incident on the microstrip was measured, either using a network analyzer or a lockin connected to the output of a microwave diode detector. Measurements were performed both with and without the presence of infrared light. These measurements were taken as a function of microwave frequency and power, sample temperature, etc.

Obviously, many modifications and variations of the present invention are possible in light of the above teachings. It is therefore to be understood that, within the scope of the appended claims, the invention may be practiced otherwise than as specifically described.

What is claimed is:

1. A sensor of infrared radiation comprising a microstrip transmission line, a microwave frequency source coupled to a first point on the transmission line, and a microwave detector coupled to a second point on the microstrip transmission line different from the first point, where the microstrip transmission line comprises a single flat metal or superconducting ground plane, a flat dielectric substrate on the ground plane, and a superconducting thin film path on the substrate, where the microstrip is an interferometer.

2. The sensor of claim 1 where the microwave detector comprises means for detecting changes in the frequency or amplitude of a microwave signal.

3. The sensor of claim 2 where the interferometer is an asymmetric ring interferometer having two legs.

4. The sensor of claim 3 where the superconducting thin film path in the asymmetric ring interferometer comprises a circular path of superconducting material where the microwave source input is not oriented 180° away from the microwave detector output, so that the two legs of the interferometer are of unequal length.

5. The sensor of claim 4 where the length of the longer leg of the interferometer is about twice the length of the shorter leg of the interferometer.

6. The sensor of claim 4 where a segment of the shorter leg of the asymmetric ring interferometer is made of a metallic conductor, and the balance of the shorter leg is made of a superconducting material.

7. The sensor of claim 6 where the length of the segment of metallic conductor is greater than the coherence length at the operating temperature of the sensor.

8. The sensor of claim 1 where the microstrip transmission line is a resonant structure comprising means for detecting changes in the frequency or amplitude of a microwave signal.

9. The sensor of claim 8 where the resonant structure is a ring resonator, the superconducting thin film path of the resonator comprising an annular path, an input line coupled to the microwave frequency source and an output line coupled to the microwave frequency detector, where the input and output lines are separated from the annular path by gaps in the superconducting thin film, said gaps being no larger than a maximum gap width that will allow for field coupling between the input and output lines and the annular path.

10. The sensor of claim 8 where the resonant structure is a ring resonator, the superconducting thin film path of the resonator comprising an annular path and a tangent input/output line coupled at one end to the microwave frequency source and at the other end to the microwave frequency detector, the annular path and the input/output line being separated by a gap no larger than a maximum gap width that will allow for field coupling between the input/output line and the annular path.

11. The sensor of claim 8 where the resonant structure is a disc resonator, the superconducting thin film path of the resonator comprising a disc-shaped path, an input line coupled to the microwave frequency source, an output line coupled to the microwave detector, where the input and output lines are separated from the disc-shaped path by gaps in the superconducting thin film, these gaps being no larger than a maximum gap width that will allow for field coupling between the input and output lines and the disc-shaped path.

12. The sensor of claim 8 where the resonant structure is a disc resonator, the superconducting thin film path of the resonator comprising a disc-shaped path and a tangent input/output line coupled at one end to the microwave frequency source and at the other end to the microwave detector, the disc-shaped path and the input/output line being separated by a gap no larger than the maximum gap width that will allow for field coupling between the input/output line and the disc-shaped path.

13. The sensor of claim 8 where the resonant structure is a coupled line resonator, the superconducting thin film path of the resonator comprising an input line coupled to the microwave frequency source, an output line coupled to the microwave detector, where the input and output lines are adjacent and basically parallel, and are separated by a gap, this gap being no larger than the maximum gap width that will allow for field coupling between the lines.

* * * * *